United States Patent
Krug et al.

(10) Patent No.: US 12,556,185 B2
(45) Date of Patent: Feb. 17, 2026

(54) BLANKING PERIODS FOR SAFELY EXECUTING EXTERNAL TRISTATE REQUESTS

(71) Applicant: Infineon Technologies AG, Neubiberg (DE)

(72) Inventors: Michael Krug, Munich (DE);
Tommaso Bacigalupo, Fuerstenfeldbruck (DE)

(73) Assignee: Infineon Technologies AG, Neubiberg (DE)

( * ) Notice: Subject to any disclaimer, the term of this patent is extended or adjusted under 35 U.S.C. 154(b) by 110 days.

(21) Appl. No.: 18/656,354

(22) Filed: May 6, 2024

(65) Prior Publication Data

US 2025/0343548 A1    Nov. 6, 2025

(51) Int. Cl.
*H03K 19/094* (2006.01)
*H03K 19/082* (2006.01)

(52) U.S. Cl.
CPC ... *H03K 19/09429* (2013.01); *H03K 19/0826* (2013.01)

(58) Field of Classification Search
CPC .... H03K 19/02; H03K 19/08; H03K 19/0826; H03K 19/094; H03K 19/09429; H03K 17/08; H03K 17/081; H03K 17/08104; H03K 17/08112; H03K 17/16;
(Continued)

(56) References Cited

U.S. PATENT DOCUMENTS

| 4,245,318 A | 1/1981 | Eckart et al. |
|---|---|---|
| 4,939,347 A | 7/1990 | Masaka et al. |
| 5,517,379 A | 5/1996 | Williams et al. |

(Continued)

FOREIGN PATENT DOCUMENTS

| DE | 10146581 C1 | 4/2003 |
|---|---|---|
| DE | 102004063946 A1 | 3/2006 |

(Continued)

OTHER PUBLICATIONS

Infineon Technologies AG, "BTN8962TA High Current PN Half Bridge NovalithIC™," Data Sheet, Rev. 1.0, May 17, 2013, 26 pp.

(Continued)

*Primary Examiner* — Jason M Crawford
(74) *Attorney, Agent, or Firm* — Shumaker & Sieffert, P.A.

(57) ABSTRACT

This disclosure is directed to systems, circuits, and techniques for controlling a power switch and for executing tristate requests. Controlling a power switch may comprise delivering drive signals from a driver circuit to the power switch to control ON/OFF switching of the power switch, wherein an ON signal causes a charge period followed by an ON period for the power switch and wherein an OFF signal causes a discharge period followed by an OFF period for the power switch; and receiving an external tristate request to place the driver circuit into a tristate. The driver circuit may immediately enter the tristate in response to the tristate request being received during the ON period or the OFF period, whereas the driver circuit may wait for completion of a tristate blanking period prior to entering tristate in response to the tristate request being received during the charge period or the discharge period.

20 Claims, 6 Drawing Sheets

(58) Field of Classification Search
CPC .... H03K 17/161; H03K 17/162; H03K 17/18;
H03K 17/28
See application file for complete search history.

(56) References Cited

U.S. PATENT DOCUMENTS

| | | | |
|---|---|---|---|
| 5,719,509 | A | 2/1998 | Chan |
| 5,862,390 | A | 1/1999 | Ranjan |
| 5,877,647 | A | 3/1999 | Vajapey et al. |
| 6,054,845 | A | 4/2000 | Feldtkeller |
| 6,144,085 | A | 11/2000 | Barker |
| 6,166,502 | A | 12/2000 | Pattok et al. |
| 6,400,163 | B1 | 6/2002 | Melcher et al. |
| 6,924,669 | B2 | 8/2005 | Itoh et al. |
| 7,279,765 | B2 | 10/2007 | Ahn et al. |
| 7,489,855 | B2 | 2/2009 | Kraus |
| 8,018,245 | B2 | 9/2011 | Sohn |
| 9,293,907 | B2 | 3/2016 | Ueta et al. |
| 9,413,352 | B2 | 8/2016 | Lim |
| 9,672,201 | B1 | 6/2017 | Uszkoreit et al. |
| 9,705,394 | B2 | 7/2017 | Ohshima |
| 9,887,532 | B2 | 2/2018 | Djelassi et al. |
| 9,893,621 | B1* | 2/2018 | Newlin ............... H03K 7/08 |
| 9,954,548 | B2 | 4/2018 | Illing et al. |
| 10,170,905 | B2 | 1/2019 | Illing et al. |
| 10,305,363 | B1 | 5/2019 | Chen et al. |
| 10,868,418 | B2 | 12/2020 | Djelassi-Tscheck et al. |
| 11,018,664 | B2 | 5/2021 | Bernardoni et al. |
| 11,139,812 | B2* | 10/2021 | Kempitiya ........... H03K 17/127 |
| 11,177,644 | B2 | 11/2021 | Mayer et al. |
| 11,271,558 | B2 | 3/2022 | Djelassi-tscheck et al. |
| 11,349,471 | B2 | 5/2022 | Mayer et al. |
| 11,404,866 | B2 | 8/2022 | Illing et al. |
| 11,405,032 | B2 | 8/2022 | Bernardoni et al. |
| 11,431,162 | B2 | 8/2022 | Djelassi-tscheck et al. |
| 11,527,881 | B2 | 12/2022 | Bernardoni et al. |
| 11,539,357 | B2 | 12/2022 | Mayer et al. |
| 12,132,475 | B1* | 10/2024 | Nuebling ............ H03K 17/296 |
| 2002/0024376 | A1 | 2/2002 | Sander |
| 2003/0001533 | A1 | 1/2003 | Kleinau et al. |
| 2005/0184715 | A1 | 8/2005 | Kidokoro et al. |
| 2005/0270869 | A1 | 12/2005 | Krischke et al. |
| 2006/0023383 | A1 | 2/2006 | Thiery et al. |
| 2007/0008744 | A1 | 1/2007 | Heo et al. |
| 2008/0074820 | A1 | 3/2008 | Thiery |
| 2009/0261766 | A1 | 10/2009 | Lurk et al. |
| 2011/0141643 | A1 | 6/2011 | Hummel et al. |
| 2012/0194119 | A1 | 8/2012 | Kroeze et al. |
| 2013/0082627 | A1 | 4/2013 | Ichikawa et al. |
| 2013/0271101 | A1* | 10/2013 | Nanov ............... H02M 1/32 327/365 |
| 2013/0301175 | A1 | 11/2013 | Posat |
| 2014/0078629 | A1 | 3/2014 | Cortigiani et al. |
| 2014/0091384 | A1 | 4/2014 | Petruzzi et al. |
| 2015/0015309 | A1* | 1/2015 | Werber ............... H03K 17/567 327/434 |
| 2015/0039545 | A1 | 2/2015 | Li et al. |
| 2015/0162407 | A1* | 6/2015 | Laven ............... H10D 62/393 257/655 |
| 2015/0285843 | A1 | 10/2015 | Michal |
| 2017/0063077 | A1 | 3/2017 | Donath et al. |
| 2017/0063367 | A1 | 3/2017 | Tsurumaru |
| 2017/0126227 | A1 | 5/2017 | Illing et al. |
| 2017/0294772 | A1 | 10/2017 | Illing et al. |
| 2017/0294918 | A1 | 10/2017 | Illing et al. |
| 2017/0294922 | A1 | 10/2017 | Illing et al. |
| 2017/0366116 | A1 | 12/2017 | Ogawa et al. |
| 2018/0048140 | A1 | 2/2018 | Takuma et al. |
| 2018/0248351 | A1 | 8/2018 | Vail et al. |
| 2018/0287365 | A1 | 10/2018 | Djelassi-Tscheck et al. |
| 2018/0367073 | A1 | 12/2018 | Haas |
| 2019/0052074 | A1 | 2/2019 | Asam |
| 2019/0253045 | A1* | 8/2019 | Bacigalupo ...... H03K 17/08128 |
| 2019/0356161 | A1 | 11/2019 | Wakazono et al. |
| 2020/0021207 | A1 | 1/2020 | Donat et al. |
| 2020/0127552 | A1* | 4/2020 | Frank ............... H02M 1/096 |
| 2020/0132725 | A1 | 4/2020 | Krummenacher et al. |
| 2021/0028615 | A1 | 1/2021 | Mayer et al. |
| 2021/0028780 | A1 | 1/2021 | Mayer et al. |
| 2021/0028781 | A1 | 1/2021 | Mayer et al. |
| 2021/0050718 | A1* | 2/2021 | Djelassi-Tscheck ..... H02H 9/02 |
| 2021/0050848 | A1 | 2/2021 | Bernardoni et al. |
| 2021/0050850 | A1 | 2/2021 | Djelassi-tscheck et al. |
| 2021/0083659 | A1* | 3/2021 | Mayer ............... H03K 17/18 |
| 2022/0285927 | A1* | 9/2022 | Bacigalupo ......... H02H 1/0007 |
| 2023/0375599 | A1 | 11/2023 | Pidutti et al. |

FOREIGN PATENT DOCUMENTS

| | | |
|---|---|---|
| DE | 102016100498 A1 | 7/2016 |
| DE | 102015144460 A1 | 3/2017 |
| DE | 102017107521 A1 | 10/2017 |
| DE | 102017107520 A1 | 11/2017 |
| DE | 102017107523 A1 | 11/2017 |
| DE | 102017106896 A1 | 10/2018 |
| DE | 102020100601 A1 | 7/2020 |
| DE | 102020105094 A1 | 9/2021 |
| WO | 0169784 A1 | 9/2001 |

OTHER PUBLICATIONS

International Standard ISO 26262-1, Second Edition, Dec. 2018, entitled "Road vehicles—Functional safety—Part 1: Vocabulary," 42 pp.
International Standard ISO 7637-2, Third Edition, Mar. 1, 2011, entitled "Road vehicles—Electrical disturbances from conduction and coupling—Part 2: Electrical transient conduction along supply lines only," 48 pp.
Jain et al., "Analysis and Design of Digital IIR Integrators and Differentiators Using Minimax and Pole, Zero, and Constant Optimization Methods," accepted May 2013, 15 pp.
Oppenheim et al., Chapter 6, Section 6.3 Basic Structures for IIR Systems, Discrete-Time Signal Processing, 2nd Edition, 1999, pp. 359-361. (Applicant points out, in accordance with MPEP 609.94(a), that the year of publication, 1999, is sufficiently earlier than the effective U.S. filing date, so that the particular month of publication is not in issue.).
U.S. Appl. No. 18/528,469, filed Dec. 4, 2023, naming inventors Djelassi-Tscheck et al.

* cited by examiner

BLANKING PERIODS FOR SAFELY EXECUTING EXTERNAL TRISTATE REQUESTS

TECHNICAL FIELD

This disclosure relates to power switches, and more specifically, techniques and driver circuits configured to control operation of power switches.

BACKGROUND

Power switches are used in a wide variety of applications in order to control power being delivered to a load. As examples, a power switch may comprise a Field Effect Transistor (FET), a bipolar junction transistor (BJT), a gallium nitride (GaN) switch, or a silicon carbide (SiC) switch, or possibly a silicon-controlled rectifier (SCR). Examples of FETs may include, but are not limited to, junction field-effect transistor (JFET), metal-oxide-semiconductor FET (MOSFET), dual-gate MOSFET, insulated-gate bipolar transistor (IGBT), any other type of FET, or any combination of the same. Examples of MOSFETS may include, but are not limited to, PMOS, NMOS, DMOS, or any other type of MOSFET, or any combination of the same. MOSFETs may be formed in silicon, gallium nitride, silicon carbide, or other materials. Examples of BJTs may include, but are not limited to, PNP, NPN, heterojunction, or any other type of BJT, or any combination of the same.

Power switches are typically controlled by a driver circuit via a pulse modulation (PM) signal, such as pulse width modulation (PWM), pulse frequency modulation (PFM), pulse duration modulation, pulse density modulation, or another type of PM signal. PM signals to be applied to the gate of a power switch so as to control on/off switching of the power switch, and thereby control the average amount of power delivered through the power switch to a load. When a power switch turns on via a PM signal, its gate is charged up to a turn-on voltage level. When a power switch turns off via the PM signal, its gate is discharged to a turn-off voltage level. In some situations, driver circuits may include a galvanic isolation barrier to galvanically isolate high voltage power switches from a low voltage domain, e.g., of a microcontroller that issues PM commands to the driver circuit.

SUMMARY

In general, this disclosure describes circuits and techniques that are applied by a driver circuit in controlling a power switch. The circuits and techniques can provide protection against problems that could occur to a larger system, due to execution of tristate requests by a driver circuit. While tristate in the driver circuit may protect the driver circuit from external harm, in some situations, a tristate by the driver circuit could result in a power switch being controlled into an undefined state, e.g., where the power switch is not fully turned on or fully turned off. The techniques of this disclosure identify such situations and implement tristate blanking periods via the driver circuit, in order to ensure that the power switch is fully ON or fully OFF whenever the driver circuit enters tristate.

In some examples, this disclosure describes a driver circuit configured to control a power switch. The driver may comprise an output pin and an input pin. The driver circuit is configured to deliver drive signals from the output pin to the power switch to control ON/OFF switching of the power switch, wherein an ON signal causes a charge period followed by an ON period for the power switch and wherein an OFF signal causes a discharge period followed by an OFF period for the power switch. The input pin is configured to receive an external tristate request to place the driver circuit into a tristate. The driver circuit is configured to: immediately enter the tristate in response to the tristate request being received during the ON period or the OFF period; and wait for completion of a tristate blanking period prior to entering tristate in response to the tristate request being received during the charge period or the discharge period.

In some examples, this disclosure describes a method of controlling a power switch, which may be implemented by a driver circuit. The method may comprise delivering drive signals from a driver circuit to the power switch to control ON/OFF switching of the power switch, wherein an ON signal causes a charge period followed by an ON period for the power switch and wherein an OFF signal causes a discharge period followed by an OFF period for the power switch; receiving an external tristate request to place the driver circuit into a tristate; immediately entering the tristate in response to the tristate request being received during the ON period or the OFF period; and waiting for completion of a tristate blanking period prior to entering tristate in response to the tristate request being received during the charge period or the discharge period.

In some examples this disclosure describes a system that comprises a power switch that includes a transistor, and a driver circuit configured to control the power switch. The driver circuit comprises an output pin, wherein the driver circuit is configured to deliver drive signals from the output pin to the power switch to control ON/OFF switching of the power switch, wherein an ON signal causes a charge period followed by an ON period for the power switch and wherein an OFF signal causes a discharge period followed by an OFF period for the power switch; and an input pin configured to receive an external tristate request to place the driver circuit into a tristate. The driver circuit is configured to: immediately enter the tristate in response to the tristate request being received during the ON period or the OFF period; and wait for completion of a tristate blanking period prior to entering tristate in response to the tristate request being received during the charge period or the discharge period.

Details of these and other examples are set forth in the accompanying drawings and the description below. Other features, objects, and advantages will be apparent from the description and drawings, and from the claims.

DETAILED DESCRIPTION

This disclosure describes circuits and techniques that are applied by a driver circuit in controlling a power switch. The circuits and techniques can provide protection against problems that could occur to a larger system, due to execution of tristate requests by a driver circuit. A tristate request generally refers to a request from another circuit (e.g., safety logic or a redundant circuit that provides a system level or circuit level safety check). A tristate request causes the driver to enter a tristate, whereby an output pin of the driver circuit is placed in a high ohmic state, which has the effect of essentially causing the gate of the power switch to be disconnected from the driver circuit such that the gate of the power switch is unable to receive any driver signals. In this way, tristate requests can protect the driver circuit or possibly other elements of a larger system, when a circuit problem or system-level problem is identified by the safety logic.

Although the tristate in the driver circuit may protect the driver circuit from external harm, in some situations, a tristate by the driver circuit could result in a power switch being controlled into an undefined state, e.g., where the power switch is not fully turned on or fully turned off. Such an undefined state of the power switch can sometimes cause system-level problems and may result in safety concerns for other elements in the system. The techniques of this disclosure may identify such situations and implement tristate blanking periods via the driver circuit, in order to ensure that the power switch is always fully ON or fully OFF whenever the driver circuit enters tristate. In other words, tristate can be delayed or avoided by the driver circuit if the gate of the power switch is being charged up or discharged, e.g., if the power switch is currently in a transition from OFF to ON or in a transition from ON to OFF.

Figure 1:
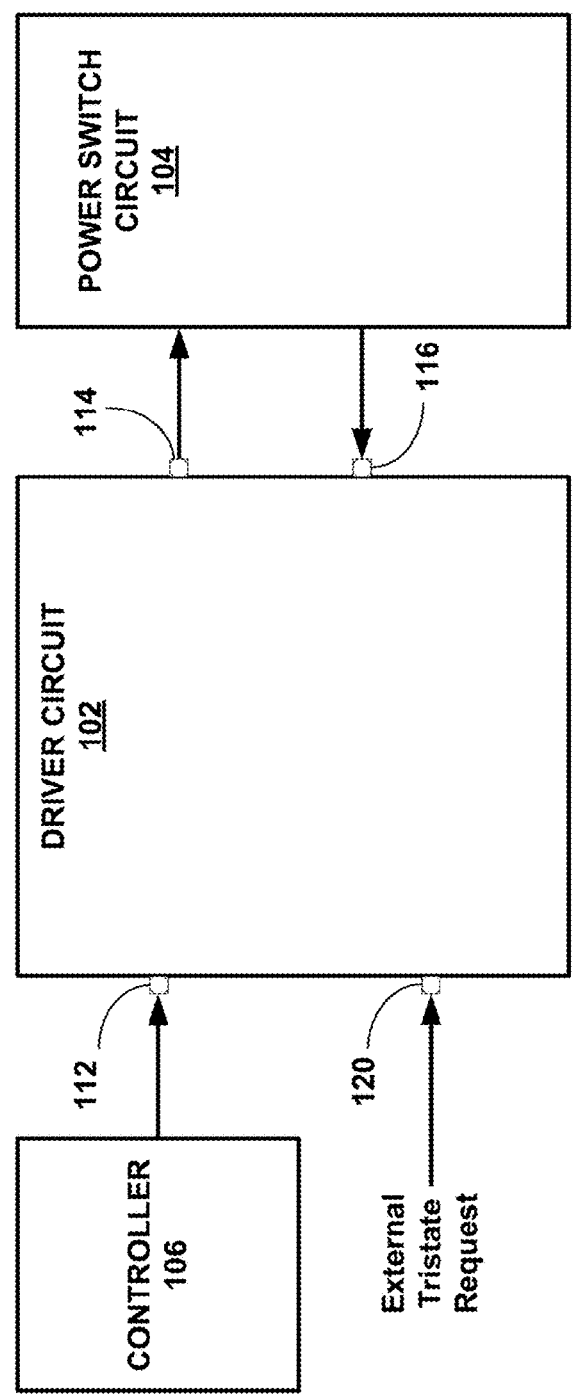
FIG. 1 is a block diagram of an example system that includes a driver circuit that may implement techniques of this disclosure.

FIG. 1 is a block diagram of an example system 100 that includes a driver circuit 102 that may implement techniques of this disclosure. Driver circuit 102 may comprise an input pin 112 configured to receive commands from a controller 106, which may comprise a processor, a microcontroller, or another type of control unit. Controller 106 may issue pulse modulation (PM) commands, such as pulse width modulation (PWM) commands, pulse density modulation commands, or other pulsed commands. Driver circuit 102 may also comprise an output pin 114 connected to a power switch circuit 104 that includes one or more power switches (e.g., power transistors that are controlled to deliver power to a load). Driver circuit 102 is configured to deliver drive signals from output pin 114 to power switch circuit 104 to control ON/OFF switching of the power switch in power switch circuit 104. Optionally, in some cases, driver circuit 102 may include one or more additional pins 116. Additional pin 116, for example, may comprise a desaturation (DESAT) detection pin, an overcurrent protection (OCP) pin, a gate clamp pin, a gate monitoring pin, or another pin connected to power switch circuit 104 or another circuit.

Driver circuit 102 may comprise a circuit configured to control a power switch based on commands from controller 106. For example, driver circuit 102 may comprise a DC/DC power converter, a voltage regulator, or another voltage control circuit configured to define gate voltages sufficient to control the ON/OFF state of a power switch. Driver circuit 102 may be connected to a supply and may receive pulse modulation (PM) control signals (e.g., pulse width modulation-PWM-control signals) from controller 106. In some cases, controller 106 that sends the control signal may be galvanically isolated from power switch circuit 104. Driver circuit 102 may be configured to define PM drive signals (e.g., PWM drive signals) based on the PM control signals from controller 106. The PM drive signals may generally conform to the PM control signals. However, the PM drive signals may be level shifted, amplified, adjusted, or otherwise converted (relative to the PM control signals) so as to define the necessary voltage levels needed, e.g., for transistor gate control of semiconductor power switch circuit 104.

Power switch circuit 104 may comprise a switch in the form of a power transistor. As examples, the power transistor within power switch circuit 104 may comprise an insulated-gate bipolar transistor (IGBT), or field effect transistor (FET), such as a metal oxide field effect transistor (MOSFET). The MOSFET may be formed in silicon, in which case the MOSFET may be called a silicon MOSFET. Alternatively, the MOSFET may be formed in another semiconductor material, such as silicon carbide (SiC) or gallium nitride (GaN), in which case the MOSFET may be called a SiC MOSFET or a GaN MOSFET. By creating PM drive signals based on PM control signals, driver circuit 102 may be configured to control an ON/OFF state of a power transistor in power switch circuit 104.

According to this disclosure, driver circuit 102 may be configured to receive an external tristate request, e.g., from another circuit or device. The other circuit or device that sends the external tristate request, for example, may comprise safety logic, a sensor, controller 106, another processor, or any circuit or system level device or module. Driver circuit 102 may comprise an input pin 120 (i.e., a tristate input pin) configured to receive the external tristate request from another circuit or device. In response to receiving an external tristate request, driver circuit 102 may be configured to place its output pin 114 into a high ohmic state, e.g., greater than 10 kOhm, which has the effect of essentially causing the gate of the power switch in power switch circuit 104 to be disconnected from driver circuit 102 such that the gate is unable to receive any driver signals. In this way, tristate requests can protect the driver circuit 102 or possibly other elements of a larger system 100, when a circuit problem or system-level problem is identified by another circuit. The tristate request is sometimes considered a type of safety command that causes driver circuit 102 to essentially disconnect its output current channel from output pin 114.

This disclosure recognizes certain situations, however, where a tristate by driver circuit 102 could result in a power switch being controlled into an undefined state, e.g., where the power switch within power switch circuit 104 is not fully turned on and fully turned off. Again, as noted above, such and undefined state of the power switch can sometimes impose system-level problems and may result in safety concerns for elements connected to the power switch. The techniques of this disclosure may identify such situations and may implement tristate blanking periods via driver circuit 102, in order to ensure that the power switch within power switch circuit 104 is always fully ON or fully OFF whenever driver circuit 102 enters tristate. In other words, tristate can be delayed or avoided in situations where the gate of the power switch within power switch circuit 104 is currently being charged up or discharged, e.g., where the power switch is currently in a transition from OFF to ON or in a transition from ON to OFF. Once the blanking period is complete, then driver circuit 102 can safely enter tristate knowing that the power switch within power switch circuit 104 is also in a defined state (i.e., either fully ON or fully OFF). In some examples, the blanking periods are predefined intervals of time associated with ON/OFF transitions or OFF/ON transitions. In other examples, the blanking periods may be defined based on measured values (e.g., measured gate voltages, measured drain-to-source, measured collector-to-emitter voltages, or another measured value of the power switch) that can be used to determine if the power switch is ON, OFF, or in a transitional state. Such measurements, for example, may be received by driver circuit 102 via additional pin 116.

According to this disclosure, driver circuit 102 is configured to deliver drive signals from output pin 114 to a power switch within power switch circuit 104 in order to control ON/OFF switching of the power switch. An ON signal from output pin 114 driver circuit 102 causes a charge period on the gate of the power switch followed by an ON period for the power switch. Similarly, an OFF signal from output pin 114 driver circuit 102 causes a discharge period on the gate of the power switch followed by an OFF period for the power switch. Input pin 120 is configured to receive an external tristate request to place driver circuit 102 into a tristate. According to this disclosure, driver circuit 102 may be configured to: immediately enter the tristate in response to the tristate request being received during the ON period or the OFF period; and wait for completion of a tristate blanking period prior to entering tristate in response to the tristate request being received during the charge period or the discharge period.

When placed into the tristate, for example, driver circuit 102 may cause output pin 114 of the driver circuit 102 to be in a high ohmic state relative to a power switch in power switch circuit 104. As an example, a high ohmic state may refer to state where the output impedance of driver circuit 102 at output pin 114 is greater than 10 kOhm. Functionally, the high ohmic state may have an effect of essentially causing the gate of the power switch in power switch circuit 104 to be disconnected from driver circuit 102 such that the gate is unable to receive any driver signals.

In some examples, the tristate blanking period is a pre-defined period that corresponds to the charge period or the discharge period of the power switch that is being controlled by driver circuit 102. Moreover, in some examples, the pre-defined period (i.e., the duration of the pre-defined period) may be a configurable parameter of driver circuit 102, which can be programmed or defined by a user, e.g., based on the lengths of charge periods and discharge periods of the power switch, based on driver strength or power supply levels, based on the duty cycles in the drive signals, or other factors. The blanking period, for example, may typically be between 1% and 20% of the ON/OFF cycle of the power switch within power switch circuit 104 that is being controlled by driver circuit 102. The ON/OFF switching of the power switch, for example, may be between 1 and 100 microseconds, e.g., with the blanking period being between 1% and 20% of the ON/OFF cycle.

In some examples, the length of the tristate blanking period is based on measured parameters rather being a fixed window of time. For example, in addition to the output pin 114, driver circuit 102 may include an additional pin 116 connected to the power switch within power switch circuit 104. The tristate blanking period may be defined (e.g., on the fly) based on a measured gate signal on additional pin 116. Additional pin 116, for example, may comprise a so-called DESAT detection pin, wherein the measured signal indicates a channel voltage of the power switch. The channel voltage may comprise a drain to source voltage for a FET or a collector to emitter voltage for an IGBT. In other examples, additional pin 116 may comprise an OCP pin, wherein the measured signal identifies a current level through the power switch. In other examples, additional pin 116 may comprise a gate clamp pin, wherein the measured signal indicates a gate voltage of the power switch. In still other examples, additional pin 116 may comprise a gate monitoring pin, wherein the measured signal indicates the gate voltage of the power switch, or another type of pin configured to monitor a parameter of the power switch within power switch circuit 104. The power switch within power switch circuit 104 and controlled by driver circuit 102, for example, may comprise an IGBT, a FET, a MOSFET, or another type of power transistor used for delivering power to a load. Tristate blanking may be defined or determined based on the measured parameters on additional pin 116, which may indicate whether or not the power switch is currently being charged or discharged, and/or whether the power switch is fully turned ON or fully turned OFF.

Figure 2:
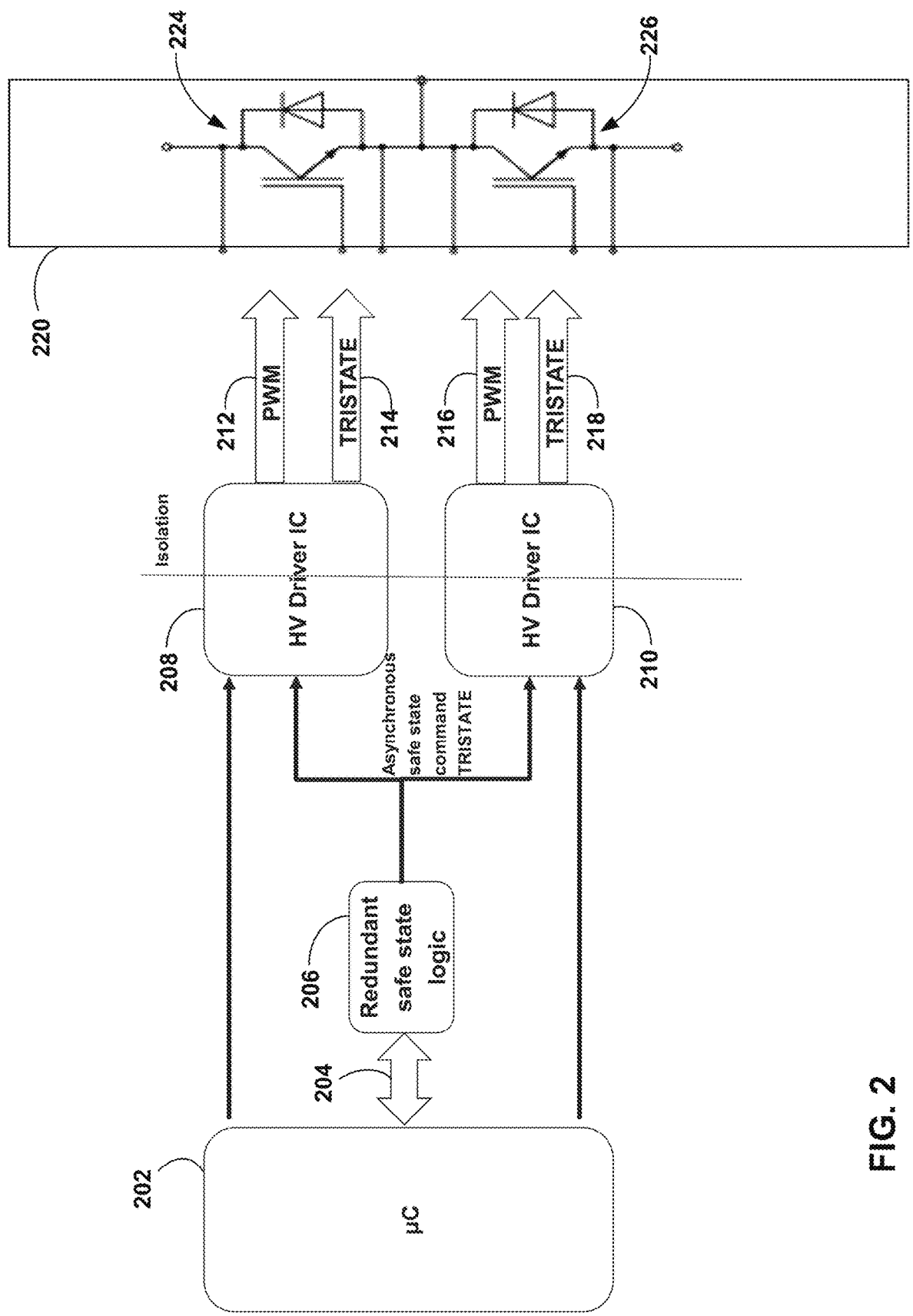
FIG. 2 is a block diagram of another example system that may utilize techniques of this disclosure.

FIG. 2 is a block diagram of an example system that may utilize techniques of this disclosure. In this example, power module 220 may comprises two power switches arranged in a high-side/low-side configuration. High-side power switch 224 may be coupled to a first supply node (e.g., Vdd), and low side power switch may be connected to a second supply node (e.g., ground). A switch node between high-side power switch 224 and low-side power switch may be configured to deliver power to a load. The load, for example, may comprise one phase of an electric motor. In some examples, power module 220 may form part of a three-phase inverter circuit for controlling an electric motor of a vehicle. However, other types of electric motors and other types of loads may be controlled by a power module similar to power module 220.

In the example of FIG. 2, driver circuit 208 is configured to control high-side power switch 224, and driver circuit 210 is configured to control low-side power switch 226. Driver circuit 208 and driver circuit 210 may each comprise high voltage (HV) driver integrated circuit (IC) that includes a galvanic isolation barrier, e.g., formed via capacitors or via a transformer (such as a so-called coreless transformer). The galvanic isolation barriers in driver circuits 208, 210 can define isolation (as illustrated) between a low voltage domain associated with microcontroller 202 and a high voltage domain associated with power module 220.

In the system shown in FIG. 2, microcontroller 202 sends PWM commands to driver circuits 208, 210. Driver circuits 208 210 generate and issue PWM drive signals according to a normal "PWM" operation mode 212, 216. In this mode, the output of driver circuits 208, 210 is connected directly to the gates of power switches 224, 226 in a low-ohmic state. In some examples, low-ohmic may refer to an output less than 30 ohms, e.g., 10 or 15 ohms.

Safely logic module 206 may comprise safety sensor or logic configured to perform one or more circuit-level or system level safety checks. In some examples, safely logic module 206 may be considered "redundant" relative to safety checks or analysis by microcontroller 202 or another unit, e.g., to comply with automotive safety standards or other safety standards that require redundancy of safety features. In some examples, safely logic module 206 may be communicatively connected to microcontroller 202 via connection 204. Connection 204 may comprise any type of communication interface, in some examples, it may comprise a watchdog connection. Safely logic module 206 may be communicatively connected directly to an input pin of driver circuit 208 and an input pin of driver circuit 210.

Safely logic module 206 may be configured to issue a tristate command to driver circuits 208, 210 in response to detecting a safety event. A tristate command may be configured to place driver circuits 208, 210 into a tristate, which is a driver "safe state." Tristate may comprise a safe state that has a highest priority in case of multiple failures inside a high voltage gate driver. In tristate operation mode 214, 218, driver circuits 208, 210 do not control the gates of power switches 224, 226. Rather, in tristate operation mode 214, 218, the gates of power switches 224, 226 are floating because the output connection from driver circuits 208, 210 to the gates of power switches 224, 226 are placed into a high ohmic state.

According to this disclosure, driver circuits 208, 210 are configured to deliver drive signals to power switches 224, 226 in order to control ON/OFF switching of the power switch. An ON signal from driver circuit 208 (e.g., while in PWM operation mode 212) causes a charge period on the gate of power switch 224 followed by an ON period for power switch 224. Similarly, an ON signal from driver circuit 210 (while in PWM operation mode 216) causes a charge period on the gate of power switch 226 followed by an ON period for power switch 226. An OFF signal from driver circuit 208 (while in PWM operation mode 212) causes a discharge period on the gate of the power switch 224 followed by an OFF period for power switch 224, and an OFF signal from driver circuit 210 (while in PWM operation mode 216) causes a discharge period on the gate of the power switch 226 followed by an OFF period for power switch 226.

Driver circuits 208, 210 may each include an input pin that is configured to receive an external tristate request (e.g., from redundant safe state logic 206) to place driver circuits 208, 210 into a tristate (also called tristate mode 214, 218). In tristate mode 214, 218, the outputs of driver circuits 208, 210 are high-ohmic such that the gates of power switches 224, 226 are uncontrolled by driver circuits 208, 210.

According to this disclosure, driver circuits 208, 2010 may be configured to: immediately enter the tristate in response to the tristate request being received during the ON period or the OFF period of respective power switch 224, 226, without waiting for any tristate blanking period; and wait for completion of the tristate blanking period prior to entering tristate in response to the tristate request being received during the charge period or the discharge period.

Again, in various examples, the tristate blanking period is a pre-defined period that corresponds to the charge period or the discharge period of the power switch 224, 226 that is being controlled by driver circuit 208, 210. In other examples, the length of the tristate blanking period is based on measured parameters of power switches 224, 226 rather being a fixed window of time.

Figure 3:
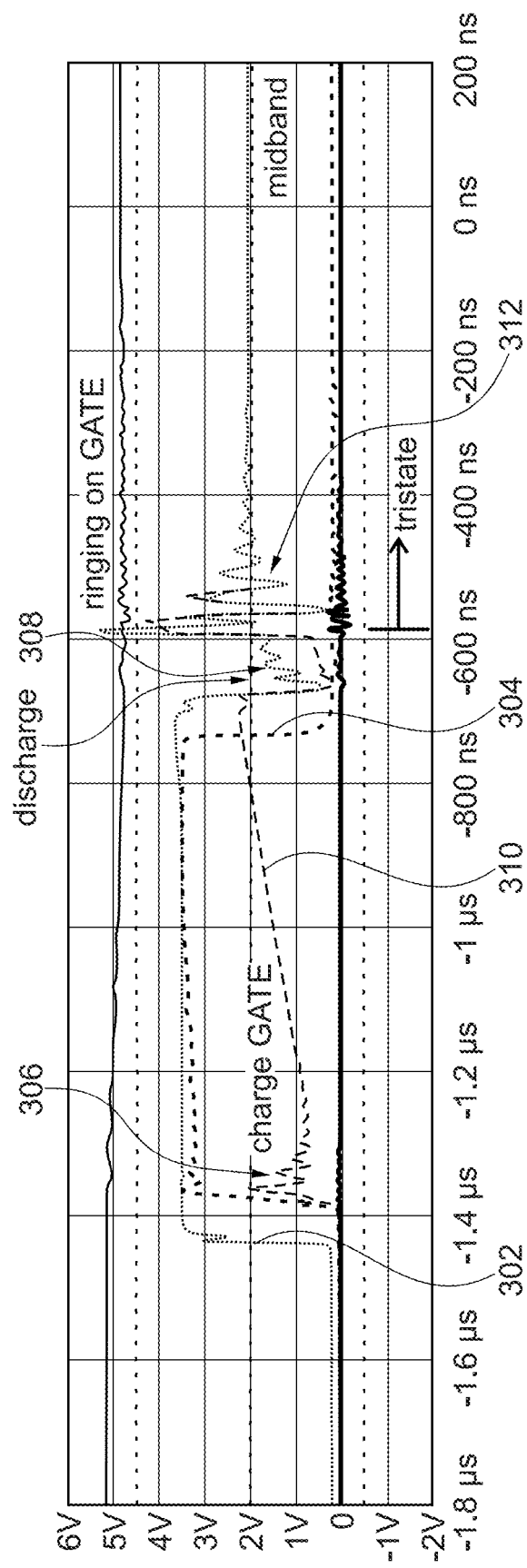
FIG. 3 is a set of graphs illustrating an undesirable tristate situation that the techniques of this disclosure may help to avoid.

FIG. 3 is a set of graphs illustrating an undesirable tristate situation that the techniques of this disclosure may help to avoid. FIG. 3 shows a PWM control signal that defines an ON transition 302 and an OFF transition 304. It is desirable to avoid immediate execution of any tristate requests during the charge up phase 306 or the charge down phase 308. In this case, execution of a tristate request as shown in FIG. 3 during the charge down phase 308 may result in undesirable ringing 312 on the gate of the transistor. In this case, the transistor may be in an undefined state, whereby the transistor is neither turned ON nor turned OFF. An asynchronous tristate command performed during a switching phase of a power semiconductor can result in the power semiconductor voltage level being completely undefined around a midband. When operating in the midband, for example, the power switch may be in a linear mode operation that may be unsafe for the power switch. Moreover, in this case, other failure indications (e.g., DESAT/OCP) may not work due to lower priority than the asynchronous request. In motor control, this situation could cause damage to an inverter circuit. Accordingly, the techniques of this disclosure identify and avoid such situations, such as by using tristate blanking during the charge up phase 306 or the charge down phase 308.

Figure 4:
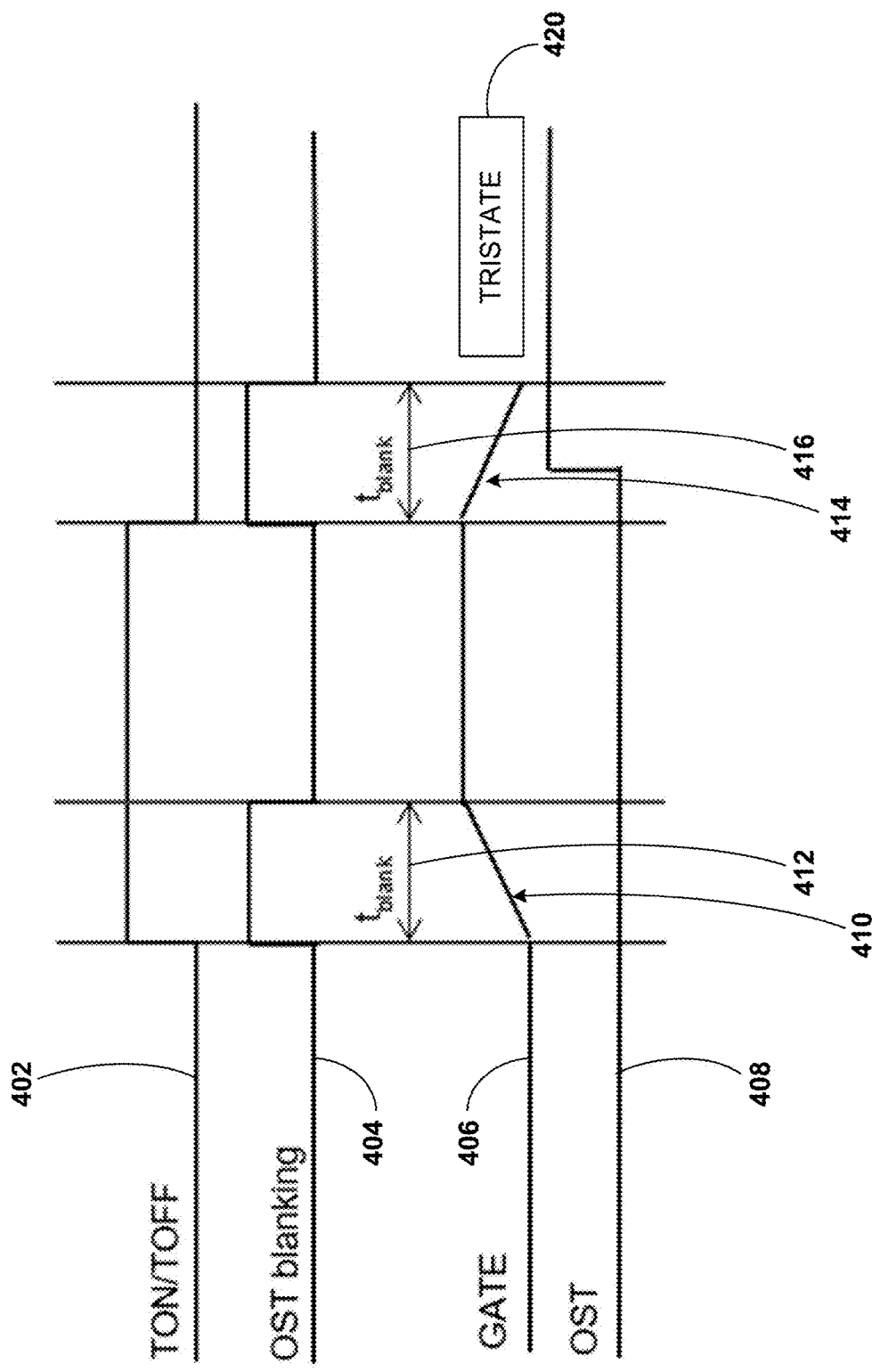
FIG. 4 is a set of graphs illustrating one example of pre-defined tristate blanking intervals.

FIG. 4 is a set of graphs illustrating one example of pre-defined tristate blanking intervals. Signal 402 represents an ON/OFF PWM signal. Signal 404 defines whether tristate blanking is ON or OFF. Tristate blanking is ON during intervals 412, 414, which correspond to time periods immediately following transitions of signal 402 and correspond to charge up phase 410 or charge down phase 414 of gate signal 406. If a tristate request signal 408 is received during a blanking period 412 or 416, the execution of that tristate request is delayed until after the blanking period 412 or 416. In this case, tristate 420 occurs after blanking period 416 to ensure that tristate 420 occurs after discharge 416 of the gate signal 406 is complete.

In some cases, a driver circuit may be configured to monitor output driver ON/OFF toggling based on PWM input from a microcontroller, and the driver circuit may execute blanking to mask transitional phases on both edges (ON and OFF) of the PWM input. Then, during the blanking active phases, the driver circuit can be configured to not execute any pending tristate requests, and instead, wait until the tristate blanking period has ended, which can ensure that the power switch has reached a defined end state (either fully ON or fully OFF). In this way, the driver circuit may better protect the power switch and other system components from potential damage. Moreover, an external microprocessor and redundant safety logic can also be kept asynchronous as driver circuit can synchronize their signals. In some cases, with the techniques of this disclosure, ringing during the transition phase can be reduced or eliminated, and the need for additional protection with external hardware may be eliminated.

In the example shown in FIG. 4, the tristate blanking periods 412, 416 may be pre-defined periods that corresponds to the charge period 410 or the discharge period 414 of the power switch that is being controlled by the driver circuit 102. In some examples, tristate blanking periods 412, 414 may be configurable parameters of a driver circuit, which can be programmed or defined by a user, e.g., based on the lengths of charge periods and discharge periods of a given power switch, or based on driver strength or power supple levels, or based on the duty cycles in the drive signals, or based on other factors. The blanking period, for example, may typically be between 1% and 20% of the ON/OFF cycle of the power switch being controlled. The ON/OFF switching of the power switch, for example, may be between 1 and 100 microseconds, e.g., with the blanking period being between 1% and 20% of the ON/OFF cycle.

In still other examples, the length of the tristate blanking period can be defined dynamically (e.g., on the fly) based on measured parameters of the power switch. The tristate blanking period, for example, may be defined (e.g., on the fly) based on a measured signal on a so-called DESAT detection pin, an OCP pin, a gate clamp pin, a gate monitoring pin, or another type of pin configured to monitor a parameter of the power switch that is being controlled.

Figure 5:
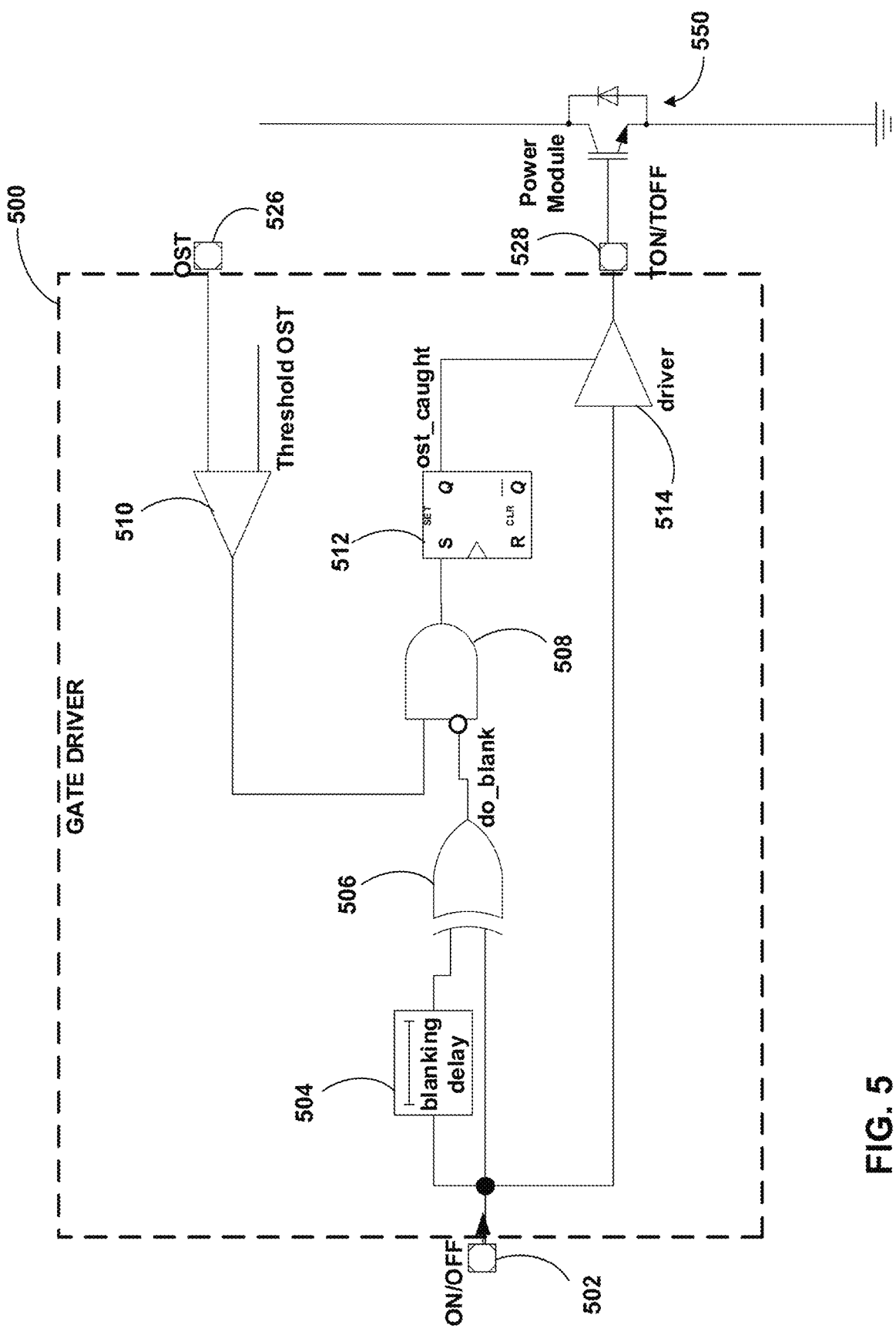
FIG. 5 is an example block diagram of a driver circuit that controls a power module consistent with an example of this disclosure.

FIG. 5 is an example block diagram of a driver circuit 500 (e.g., a gate driver) that controls a power module 550 consistent with an example of this disclosure and implements pre-defined tristate blanking consistent with the example graphs shown in FIG. 4. ON/OFF pin 502 of driver circuit 500 may be configured to receive PWM control signals from a processor, and driver 514 may be configured to output PWM drive signals on output pin 528 to the gate of power module in order to control the ON/OFF state of power module 550.

Output stage tristate (OST) pin 526 may comprise a pin configured to receive a tristate request from another circuit or device, such as safely logic. Comparator 510 may compare any signal on OST pin 526 to an OST threshold to determine if the signal is a tristate request. However, a tristate request on OST pin does not always immediately set the tristate mode of driver 514 in memory circuit 512 (e.g., a flip-flop). Instead, logic elements 504, 506, 508 are configured to implement tristate blanking during intervals of time that correspond to charge up or charge down phases of power module 550, e.g., short periods of time that immediately follow any ON/OFF transitions in the PWM control signal on ON/OFF pin 502. In this case, a transition on in the PWM control signal on ON/OFF pin 502 is sent to driver 514 but delayed by logic elements 504, 506, 508 until a blanking period defined by logic 504 has passed. Logic 506 only passes along the signal logic 508 after the blanking period is complete. Similarly, logic 508 only passes along an active tristate signal on OST pin 526 after the blanking period is complete. Thus, with the example driver circuit 500, a tristate request on OST pin may be executed immediately by driver 514 as long as a blanking period after a transition on ON/OFF pin 502 is completed. But if a tristate request is received on OST pin during a blanking period (which is during the change up or charge down period that immediately follows a transition signal on ON/OFF pin 502), the tristate request may be delayed and tristate avoided by driver 514 until after the blanking period is completed.

In still other examples, if the driver knows (e.g., via a DESAT-node or another pin) whether the power switch is fully conducting current or blocking a voltage, this DESAT node voltage information can be used to determine whether the device is in a proper ON/OFF state or whether blanking should be performed with regard to any tristate requests. Thus, DESAT information or other power switch measurements may also be used to define tristate blanking (e.g., on the fly). Gate clamp pins could also be used to define tristate blanking. Gate clamp functionality may determine whether a gate-voltage has reached the proper and requested rail. Therefore, in some examples, tristate blanking could be performed based on gate clamp information (e.g., using comparators to delay the internal tristate request based on measured signals on a gate clamp pin). An overcurrent protection pin, a gate monitoring pin, a current monitoring pin, or other pins connected to the power switch for other purposes could also be used to implement tristate blanking consistent with this disclosure.

Figure 6:
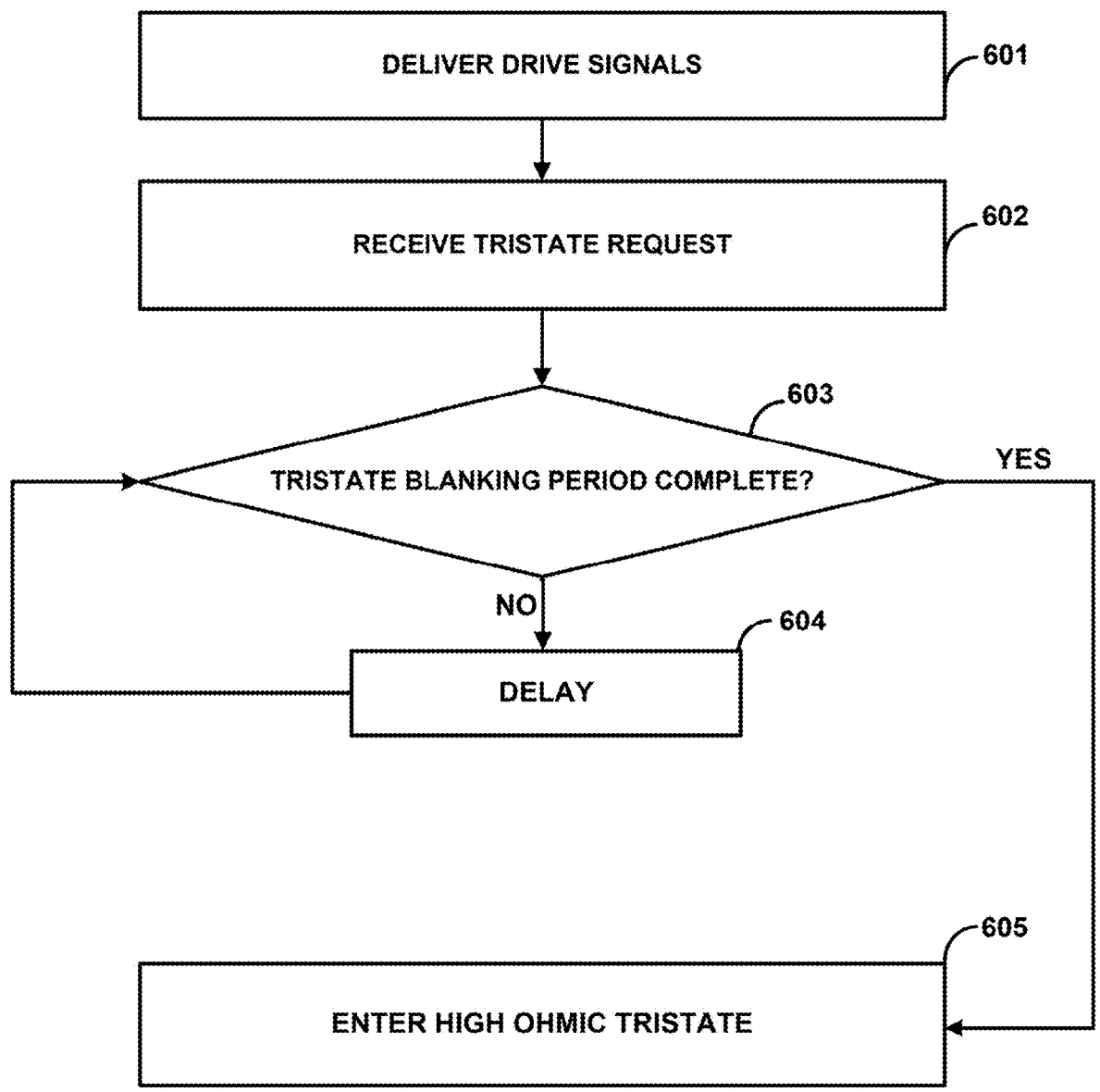
FIG. 6 is a flow diagram illustrating a method of controlling a power switch, which may be performed by a driver circuit according to this disclosure.

FIG. 6 is a flow diagram illustrating a method of controlling a power switch, which may be performed by a driver circuit according to this disclosure. FIG. 6 will be described from the perspective of driver circuit 102 of FIG. 1 for controlling a power switch within power switch circuit 104, although other driver circuits could perform the method. As shown in FIG. 6, driver circuit 102 delivers drive signals to a power switch (601). The drive signals may control ON/OFF switching of the power switch, wherein an ON signal causes a charge period followed by an ON period for the power switch and wherein an OFF signal causes a discharge period followed by an OFF period for the power switch. Driver circuit 102 also receives an external tristate (602). The external tristate request may be received on a tristate input pin 120 (e.g., an OST pin) and may define a request (e.g., a command) to place driver circuit 102 into a tristate. Driver circuit 102 may be configured to determine whether a tristate blanking period is complete (603). If not (no branch of 603), tristate is delayed in driver circuit 102 (604). If so (yes branch of 603), tristate is implemented in driver circuit 102 whereby driver circuit 102 is placed into a high ohmic state referred to as "tristate" (605). In other words, driver circuit 102 is configured to immediately enter the tristate in response to a tristate request being received during an ON period (i.e., fully on) or an OFF period (i.e., fully OFF) of the power switch being controlled, but driver circuit 102 is configured to wait for completion of a tristate blanking period prior to entering tristate in response to the tristate request being received during a charge period or a discharge period.

The techniques described in this disclosure may be implemented in circuitry. In various examples, the techniques may be implemented, at least in part, in circuitry, hardware, software, firmware or any combination thereof. For example, various aspects of the described techniques may be implemented within one or more logical elements, processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit comprising hardware may also perform one or more of the techniques of this disclosure.

Such circuitry, hardware, software, and firmware may be implemented within the same device or within separate devices to support the various operations and functions described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware or software components. Rather, functionality associated with one or more modules or units may be performed by separate hardware or software components, or integrated within common or separate hardware or software components.

It may also be possible for one or more aspects of this disclosure to be performed in software, in which case those aspects of the techniques described in this disclosure may also be embodied or encoded in a computer-readable medium, such as a computer-readable storage medium, containing instructions. Instructions embedded or encoded in a computer-readable storage medium may cause a processor, to perform the method, e.g., when the instructions are executed. The instructions, in this example, may be stored in a memory, which may comprise random access memory (RAM), read only memory (ROM), programmable read only memory (PROM), erasable programmable read only memory (EPROM), electronically erasable programmable read only memory (EEPROM), flash memory, or other computer readable media.

The following clauses may illustrate one or more aspects of the disclosure.

Clause 1—A driver circuit configured to control a power switch, the driver circuit comprising: an output pin, wherein the driver circuit is configured to deliver drive signals from the output pin to the power switch to control ON/OFF switching of the power switch, wherein an ON signal causes a charge period followed by an ON period for the power switch and wherein an OFF signal causes a discharge period followed by an OFF period for the power switch; an input pin configured to receive an external tristate request to place the driver circuit into a tristate, wherein the driver circuit is configured to: immediately enter the tristate in response to the tristate request being received during the ON period or the OFF period; and wait for completion of a tristate blanking period prior to entering the tristate in response to the tristate request being received during the charge period or the discharge period.

Clause 2—The driver circuit of clause 1, wherein in the tristate, the driver circuit causes the output pin of the driver circuit to be in a high ohmic state relative to the power switch.

Clause 3—The driver circuit of clause 1 or 2, wherein the tristate blanking period is a pre-defined period that corresponds to the charge period or the discharge period.

Clause 4—The driver circuit of clause 3, wherein the pre-defined period is a configurable parameter of the driver circuit.

Clause 5—The driver circuit of clause 1 or 2, wherein the driver circuit includes an additional pin connected to the power switch, and wherein the tristate blanking period is defined based on a measured signal on the additional pin.

Clause 6—The driver circuit of clause 5, wherein the additional pin comprises one of: a DESAT detection pin, wherein the measured signal indicates a channel voltage of the power switch; an OCP pin, wherein the measured signal identifies a current level through the power switch; a gate clamp pin, wherein the measured signal indicates a gate voltage of the power switch; or a gate monitoring pin, wherein the measured signal indicates the gate voltage of the power switch.

Clause 7—The driver circuit of any of clauses 1-6, wherein the driver circuit is configured to control: an IGBT, a FET, or a MOSFET.

Clause 8—The driver circuit of any of clauses 1-7, wherein an ON/OFF cycle associated with the ON/OFF switching of the power switch is between 1 and 100 microseconds and the blanking period is between 1% and 20% of the ON/OFF cycle.

Clause 9—A method of controlling a power switch, the method comprising: delivering drive signals from a driver circuit to the power switch to control ON/OFF switching of the power switch, wherein an ON signal causes a charge period followed by an ON period for the power switch and wherein an OFF signal causes a discharge period followed by an OFF period for the power switch; receiving an external tristate request to place the driver circuit into a tristate; immediately entering the tristate in response to the tristate request being received during the ON period or the OFF period; and waiting for completion of a tristate blanking period prior to entering the tristate in response to the tristate request being received during the charge period or the discharge period.

Clause 10—The method of clause 9, wherein in the tristate, the driver circuit is configured to cause an output pin of the driver circuit to be in a high ohmic state relative to the power switch.

Clause 11 The method of clause 9 or 10, wherein the tristate blanking period is a pre-defined period that corresponds to the charge period or the discharge period.

Clause 12—The method of clause 11, wherein the pre-defined period is a configurable parameter of the driver circuit, the method further comprising receiving user input to define the configurable parameter for the driver circuit.

Clause 13—The method of clause 9 or 10, wherein the driver circuit includes an output pin connected to the power switch for delivering the drive signals and an additional pin connected to the power switch, the method further comprising: measuring a signal on the additional pin and defining the tristate blanking period based on the measured signal on the additional pin.

Clause 14—The method of clause 13, wherein the additional pin comprises: a DESAT detection pin, wherein the measured signal indicates a channel voltage of the power switch; an OCP pin, wherein the measured signal identifies a current level through the power switch; a gate clamp pin, wherein the measured signal indicates a gate voltage of the power switch; or a gate monitoring pin, wherein the measured signal indicates the gate voltage of the power switch.

Clause 15—The method of any of clauses 9-14, wherein the driver circuit is configured to control: an IGBT, a FET, or a MOSFET.

Clause 16—The method of any of clauses 9-15, wherein an ON/OFF cycle associated with the ON/OFF switching of the power switch is between 1 and 100 microseconds and the blanking period is between 1% and 20% of the ON/OFF cycle.

Clause 17—A system comprising: a power switch that includes a transistor; and a driver circuit configured to control the power switch, the driver circuit comprising: an output pin, wherein the driver circuit is configured to deliver drive signals from the output pin to the power switch to control ON/OFF switching of the power switch, wherein an ON signal causes a charge period followed by an ON period for the power switch and wherein an OFF signal causes a discharge period followed by an OFF period for the power switch; an input pin configured to receive an external tristate request to place the driver circuit into a tristate, wherein the driver circuit is configured to: immediately enter the tristate in response to the tristate request being received during the ON period or the OFF period; and wait for completion of a tristate blanking period prior to entering the tristate in response to the tristate request being received during the charge period or the discharge period.

Clause 18—The system of clause 17, the system further comprising: a microcontroller configured to deliver control signals to the driver circuit, wherein the control signals define the drive signals.

Clause 19—The system of clause 17 or 18, wherein the tristate blanking period is a pre-defined period that corresponds to the charge period or the discharge period.

Clause 20—The system of clause 17 or 18, wherein the driver circuit includes an additional pin connected to the power switch, and wherein the tristate blanking period is defined based on a measured signal on the additional pin.

Various aspects have been described in this disclosure. These and other aspects are within the scope of the following claims.

The invention claimed is:

1. A driver circuit configured to control a power switch, the driver circuit comprising:
an output pin, wherein the driver circuit is configured to deliver drive signals from the output pin to the power switch to control ON/OFF switching of the power switch, wherein an ON signal causes a charge period followed by an ON period for the power switch and wherein an OFF signal causes a discharge period followed by an OFF period for the power switch;
an input pin configured to receive an external tristate request to place the driver circuit into a tristate, wherein the driver circuit is configured to:

immediately enter the tristate in response to the tristate request being received during the ON period or the OFF period; and wait for completion of a tristate blanking period prior to entering the tristate in response to the tristate request being received during the charge period or the discharge period.

2. The driver circuit of claim 1, wherein in the tristate, the driver circuit causes the output pin of the driver circuit to be in a high ohmic state relative to the power switch.

3. The driver circuit of claim 1, wherein the tristate blanking period is a pre-defined period that corresponds to the charge period or the discharge period.

4. The driver circuit of claim 3, wherein the pre-defined period is a configurable parameter of the driver circuit.

5. The driver circuit of claim 1, wherein the driver circuit includes an additional pin connected to the power switch, and wherein the tristate blanking period is defined based on a measured signal on the additional pin.

6. The driver circuit of claim 5, wherein the additional pin comprises one of:
 a desaturation (DESAT) detection pin, wherein the measured signal indicates a channel voltage of the power switch;
 an overcurrent protection (OCP) pin, wherein the measured signal identifies a current level through the power switch;
 a gate clamp pin, wherein the measured signal indicates a gate voltage of the power switch; or
 a gate monitoring pin, wherein the measured signal indicates the gate voltage of the power switch.

7. The driver circuit of claim 1, wherein the driver circuit is configured to control:
 an insulated-gate bipolar transistor (IGBT),
 a field effect transistor (FET), or
 a metal oxide field effect transistor (MOSFET).

8. The driver circuit of claim 1, wherein an ON/OFF cycle associated with the ON/OFF switching of the power switch is between 1 and 100 microseconds and the blanking period is between 1% and 20% of the ON/OFF cycle.

9. A method of controlling a power switch, the method comprising:
 delivering drive signals from a driver circuit to the power switch to control ON/OFF switching of the power switch, wherein an ON signal causes a charge period followed by an ON period for the power switch and wherein an OFF signal causes a discharge period followed by an OFF period for the power switch;
 receiving an external tristate request to place the driver circuit into a tristate;
 immediately entering the tristate in response to the tristate request being received during the ON period or the OFF period; and
 waiting for completion of a tristate blanking period prior to entering the tristate in response to the tristate request being received during the charge period or the discharge period.

10. The method of claim 9, wherein in the tristate, the driver circuit is configured to cause an output pin of the driver circuit to be in a high ohmic state relative to the power switch.

11. The method of claim 9, wherein the tristate blanking period is a pre-defined period that corresponds to the charge period or the discharge period.

12. The method of claim 11, wherein the pre-defined period is a configurable parameter of the driver circuit, the method further comprising receiving user input to define the configurable parameter for the driver circuit.

13. The method of claim 9, wherein the driver circuit includes an output pin connected to the power switch for delivering the drive signals and an additional pin connected to the power switch, the method further comprising:
 measuring a signal on the additional pin and defining the tristate blanking period based on the measured signal on the additional pin.

14. The method of claim 13, wherein the additional pin comprises:
 a desaturation (DESAT) detection pin, wherein the measured signal indicates a channel voltage of the power switch;
 an overcurrent protection (OCP) pin, wherein the measured signal identifies a current level through the power switch;
 a gate clamp pin, wherein the measured signal indicates a gate voltage of the power switch; or
 a gate monitoring pin, wherein the measured signal indicates the gate voltage of the power switch.

15. The method of claim 9, wherein the driver circuit is configured to control:
 an insulated-gate bipolar transistor (IGBT),
 a field effect transistor (FET), or
 a metal oxide field effect transistor (MOSFET).

16. The method of claim 9, wherein an ON/OFF cycle associated with the ON/OFF switching of the power switch is between 1 and 100 microseconds and the blanking period is between 1% and 20% of the ON/OFF cycle.

17. A system comprising:
 a power switch that includes a transistor; and
 a driver circuit configured to control the power switch, the driver circuit comprising:
 an output pin, wherein the driver circuit is configured to deliver drive signals from the output pin to the power switch to control ON/OFF switching of the power switch, wherein an ON signal causes a charge period followed by an ON period for the power switch and wherein an OFF signal causes a discharge period followed by an OFF period for the power switch;
 an input pin configured to receive an external tristate request to place the driver circuit into a tristate, wherein the driver circuit is configured to:
 immediately enter the tristate in response to the tristate request being received during the ON period or the OFF period; and
 wait for completion of a tristate blanking period prior to entering the tristate in response to the tristate request being received during the charge period or the discharge period.

18. The system of claim 17, the system further comprising:
 a microcontroller configured to deliver control signals to the driver circuit, wherein the control signals define the drive signals.

19. The system of claim 17, wherein the tristate blanking period is a pre-defined period that corresponds to the charge period or the discharge period.

20. The system of claim 17, wherein the driver circuit includes an additional pin connected to the power switch, and wherein the tristate blanking period is defined based on a measured signal on the additional pin.

* * * * *